(12) United States Patent
Gothoskar et al.

(10) Patent No.: US 6,897,498 B2
(45) Date of Patent: May 24, 2005

(54) POLYCRYSTALLINE GERMANIUM-BASED WAVEGUIDE DETECTOR INTEGRATED ON A THIN SILICON-ON-INSULATOR (SOI) PLATFORM

(75) Inventors: Prakash Gothoskar, Allentown, PA (US); Margaret Ghiron, Allentown, PA (US); Vipulkumar Patel, Monmouth Junction, NJ (US); Robert Keith Montgomery, Easton, PA (US); Kalpendu Shastri, Orefield, PA (US); Soham Pathak, Allentown, PA (US); Katherine A. Yanushefski, Zionsville, PA (US)

(73) Assignee: SiOptical, Inc., Allentown, PA (US)

( * ) Notice: Subject to any disclaimer, the term of this patent is extended or adjusted under 35 U.S.C. 154(b) by 0 days.

(21) Appl. No.: 10/772,724

(22) Filed: Feb. 5, 2004

(65) Prior Publication Data

US 2004/0188794 A1 Sep. 30, 2004

Related U.S. Application Data

(60) Provisional application No. 60/459,348, filed on Mar. 31, 2003.

(51) Int. Cl.⁷ .............................................. H01L 27/148
(52) U.S. Cl. ..................... 257/226; 257/227; 257/228; 257/233
(58) Field of Search ................. 257/226–228, 257/233

(56) References Cited

U.S. PATENT DOCUMENTS 6,090,636 A  7/2000  Geusic et al.
6,316,281 B1 11/2001 Lee et al.
6,387,720 B1  5/2002 Misheloff et al.
6,504,977 B1  1/2003 Krishnamoorthy
2002/0068396 A1 6/2002 Fitzgerald

OTHER PUBLICATIONS

Hiroshi Nishihara, Masamitsu Haruna, Toshiaki Suhara, "Optical Integrated Circuits" , McGraw–Hill Book Company, 1989–Printed in the United States of America.

P.K. Tien, R. Ulrich, "Theory of Prism–Film Coupler and Thin–Film Light Guides", Journal of the Optical Society of America, vol. 60, No. 10, Oct. 1970.

L.A. Coldren, Y.A. Akulova, E.M. Strzelecka, B.J. Thibealt, J.C. Ko, and D.A. Louderback, "Vcsel Array Packaging for Free Space Interconnects" Report 1996–1997 for Micro Project 96–050, Materials and Electrical & Computer Engineering Departments, University of California, Santa Barbara CA 93106.

*Primary Examiner*—Fetsum Abraham

(57) ABSTRACT

A photodetector for use with relatively thin (i.e., submicron) silicon optical waveguides formed in a silicon-on-insulator (SOI) structure comprises a layer of poly-germanium disposed to couple at least a portion of the optical signal propagating along the silicon optical waveguide. Tight confinement of the optical signal within the waveguide structure allows for efficient evanescent coupling into the poly-germanium detector. The silicon optical waveguide may comprise any desired geometry, with the poly-germanium detector formed to either cover a portion of the waveguide, or be butt-coupled to an end portion of the waveguide. When covering a portion of the waveguide, poly-germanium detector may comprise a "wrap-around" geometry to cover the side and top surfaces of the optical waveguide, with electrical contacts formed at opposing ends of the detector.

21 Claims, 14 Drawing Sheets

(a)

(b)

(a)

(b)

(a)

(b)

(a)

(b)

(a)

(b)

(a)

(b)

(a)

(b)

(a)

(b)

POLYCRYSTALLINE GERMANIUM-BASED WAVEGUIDE DETECTOR INTEGRATED ON A THIN SILICON-ON-INSULATOR (SOI) PLATFORM

CROSS-REFERENCE TO RELATED APPLICATION

This application claims the benefit of Provisional Application No. 60/459,348, filed Mar. 31, 2003.

TECHNICAL FIELD

The present invention related to optical detectors and, more particularly, to a polycrystalline germanium-based waveguide detector integrated on a thin silicon-on-insulator (SOI) platform.

BACKGROUND OF THE INVENTION

In an SOI-based opto-electronic platform, relatively thin (e.g., <1 μm) silicon waveguides are used to distribute light across the entire chip and provide multiple optical functions (for example, splitting/combining, modulation, switching, wavelength multiplexing/demultiplexing, add/drop, equalization, and dispersion compensation). The ability for light coupling and manipulation in a thin waveguide on an SOI platform enables a true integration of optics and microelectronics on a single silicon chip. One of the reasons for the high cost, high power consumption and large form factors of the optical components/subsystems in the optical communication industry is the lack of available component integration. Today's opto-electronic industry relies upon discrete building blocks and hybrid integration of various components. Similar to the IC industry in the 1960s, these discrete components are open loop, where the loop is then closed externally (using, for example, external optics and electronics), resulting in lower yields and higher costs. Using on-chip feedback control techniques, analog ICs meet very high precision specifications at very low cost, in spite of significant operating condition variations.

Conversion of photons to electrons is essential for the successful integration of microphotonics with microelectronics. InGaAs-based PIN photodetectors are commonly used for telecommunication applications, due to their high responsivity and speed. The majority of the InGaAs-based detectors are normal incidence detectors, and integration of such devices on silicon surfaces is expensive. Additionally, integration of high-speed InGaAs detectors requires special optics to focus light into a small active area, which has been found to effect device performance.

Germanium-based area detectors are well known in the art. Germanium detectors exhibit a higher dark current than InGaAs-based detectors, which limit their application in the telecommunications industry. In recent years, attempts have been made to improve the performance of polycrystalline germanium-based detectors for these applications. One exemplary prior art poly-germanium detector is discussed in an article entitled "*Efficient high-speed near-infrared Ge photodetectors integrated on Si substrates*", by L. Colace et al., appearing in Applied Physics Letters, Vol. 76, p. 1231 et seq., 2000.

In view of all of the above, a need still remains for a low cost, efficient optical to electrical conversion mechanism for simplifying the integration of optical and electronic functions on a single silicon-based chip.

SUMMARY OF THE INVENTION

The need remaining in the prior art is addressed by the present invention, which relates to optical detectors and, more particularly, to a polycrystalline germanium-based waveguide detector integrated on a thin silicon-on-insulator (SOI) platform.

In particular, the present invention relates to various poly-germanium-based photodetector structures that are monolithically integrated with relatively thin silicon waveguides formed in an SOI platform. Poly-germanium may be formed using various techniques such as, but not limited to, physical vapor deposition (PVD) or chemical vapor deposition (CVD). In SOI-based thin silicon waveguides, the optical mode is tightly confined, due to the large index contrast ($n_{Si}$=3.5 and $n_{SiO2}$=1.5). In accordance with the present invention, the light propagating in a silicon waveguide, upon reaching the region with the overlying poly-germanium layer undergoes absorption into the poly-germanium. The band gap of germanium (~0.72 eV) ensures effective absorption of near-IR wavelength light. The electron-hole pairs generated due to the absorption of light can be efficiently collected using suitable electrode structures fabricated upon the poly-germanium layer. The physical dimensions of the poly-germanium layer (i.e., height, width and length) are used to control the amount of light that is absorbed.

In a preferred embodiment of the poly-germanium detector of the present invention, the detector layer is formed as a wrap-around geometry over a silicon strip waveguide formed on an SOI platform, with contacts formed on either side of the strip for biasing the detector. The narrow lateral waveguide dimensions (~1 μm) allow for high speed, low dark current operation with a high responsivity, due to a significantly smaller area when compared to normal incidence detectors.

In an alternative embodiment, the poly-germanium layer is formed directly upon a slab silicon waveguide and the light is focused into the poly-germanium detector using a focusing element (for example, a mirror, lens or a concave grating) fabricated in the silicon layer. The focal spot size achievable in silicon due to its higher refractive index is given by:

$$W_{min} = \left(\frac{0.6\, \lambda_{Si}}{NA}\right),$$

where $W_{min}$ is the minimum beam diameter, $\lambda_{Si}$ is the wavelength of light in silicon and NA is the numerical aperture of the focusing element. The wavelength of light in silicon is much smaller than in free space, which enables a very narrow focusing of light in a thin silicon waveguide. The detector area can then be very small (for example, 10 μm²), allowing for high speed operation of the detector. Additionally, the shape of the poly-germanium detector layer may be tailored to minimize reflection losses and/or appropriately focus the light into the detector.

In yet another embodiment of the present invention, the poly-germanium detector is formed upon a narrow silicon rib waveguide such that the light propagating along the rib waveguide interacts with the poly-germanium layer along the entire length of the waveguide. This results in a complete absorption of light without the drawback of the absorption length and the carrier collection length being the same (as in the case of a normal incidence detector). In this arrangement of the present invention, the carrier collection length remains the same, while the absorption of light is independently controlled by the length of the poly-germanium detector.

BRIEF DESCRIPTION OF THE DRAWINGS

Referring now to the drawings.

DETAILED DESCRIPTION

Figure 1:
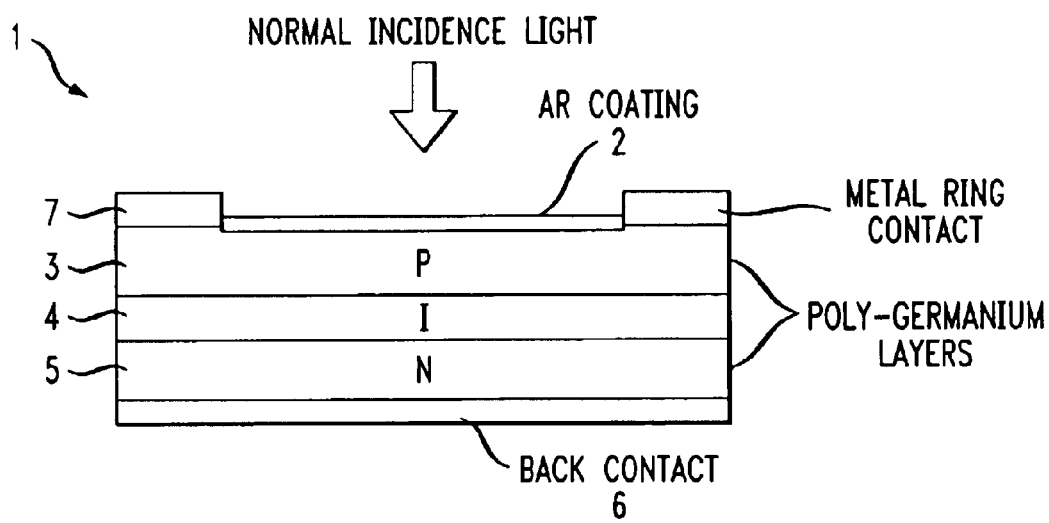
FIG. 1 contains a cross-sectional view of a conventional prior art normal incidence photodetector.

Prior to describing in detail the poly-germanium SOI-based photodetector of the present invention, it is useful to briefly describe the working of a conventional, normal incidence photodetector. FIG. 1 illustrates, in cross-sectional view, one such conventional prior art detector 1. Detector 1 is considered a "normal" incidence photodetector since the direction of the incoming light beam is perpendicular to the plane of the impinging surface, in this case, an AR coating layer 2. Detector 1 is a p-i-n photodetector comprising a p-doped poly-germanium layer 3, an intrinsically doped layer 4 and an n-doped layer 5. The electrical contacts are formed on opposing sides of detector 1, as shown, with a bottom contact 6 and a top, ring-shaped contact 7. The thickness and doping of layers 3, 4 and 5 determine the amount of light absorbed and the speed of response of detector 1. The absorption area within p-doped layer 3 is typically on the order of 100 $\mu m^2$ (the larger absorption area resulting from the lack of cost-effective methods of focusing the light into detector 1). The relatively large absorption areas of these conventional prior art detectors limit their scope to applications that can tolerate the resulting higher dark current. In some cases, the thickness of the p-i-n layers is reduced to improve the speed of response, at the sacrifice of the responsivity (due to less absorption).

Figure 2:
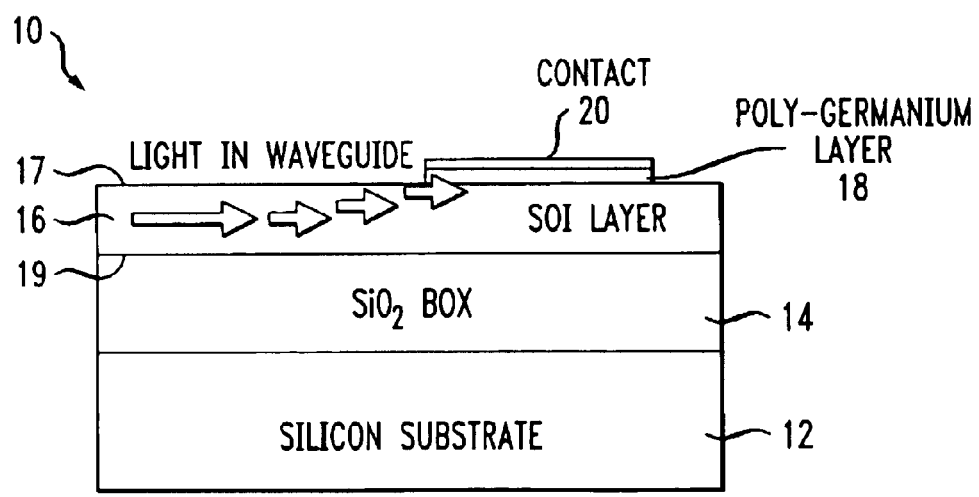
FIG. 2 illustrates a cross-sectional view of an exemplary SOI structure upon which a poly-germanium photodetector of the present invention may be formed.

FIG. 2 contains a cross-sectional view of an exemplary SOI structure 10 upon which a poly-germanium layer may be disposed and used as a photodetector in accordance with the teachings of the present invention. As shown, SOI structure 10 includes a silicon substrate 12 upon which is formed a silicon dioxide buried oxide layer 14. A relatively thin slab silicon waveguide layer 16 is shown as disposed over buried oxide layer 14, where slab silicon waveguide 16 is used to provide propagation of an optical signal along the length of the waveguide. A poly-germanium layer 18 is disposed over a portion of waveguide layer 16 Fundamental to every embodiment of the present invention, as discussed below, is that it comprises a monolithically integrated poly-germanium detector associated with a relatively thin (sub-micron) silicon waveguide formed in an SOI-based opto-electronic platform operating with near-IR wavelength light (i.e., 1.1–1.7 $\mu m$) As will be discussed in detail below in the various embodiments, both electrical contacts are formed on the "top" of the device (i.e., planar contact geometry), which is considered easier to work with from a manufacturing and packaging point of view than the prior art need for "top" and "bottom" contacts.

Referring back to FIG. 2, the use of the relatively thin (i.e. <1 $\mu m$) silicon waveguide 16 functions to confine a propagating light signal in the vertical dimension. As the signal propagates along the waveguide, it is coupled into poly-germanium layer 18, creating electron-hole pairs. The distance between the separate metal contacts (as will be described below) can be made very short—on the order of the waveguide dimensions—ensuring a high speed operation without sacrificing responsivity. The absorption of light in the waveguide detector arrangement of the present invention, as will be discussed in detail below, is controlled by the length and doping of poly-germanium detector layer 18.

As a result of the sub-micron geometry of waveguide layer 16, an evanescent tail of the optical mode extends beyond the silicon waveguide layer, making it very sensitive to the top and bottom surfaces of the waveguide. Fundamental to the present invention is that the poly-germanium layer is formed upon the silicon waveguide to absorb the light propagating in the waveguide.

Figure 17:
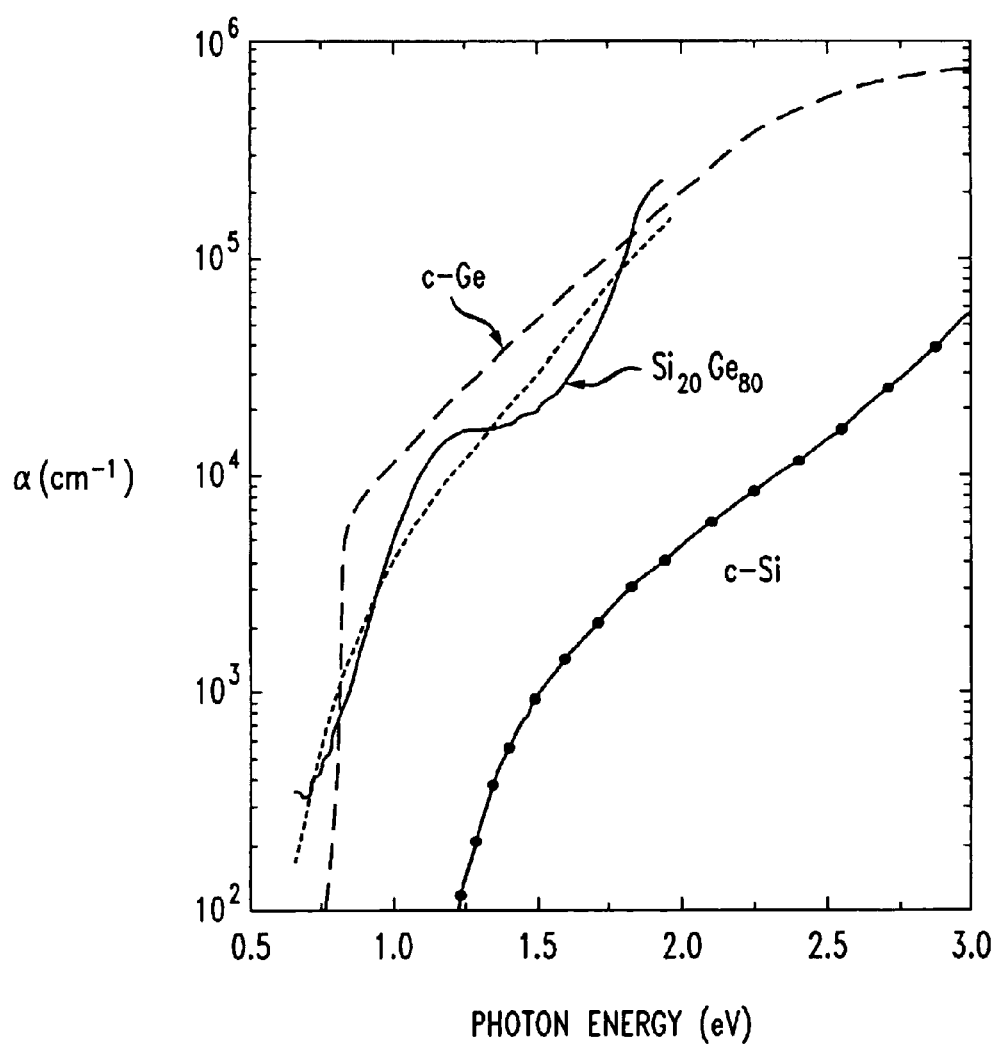
FIG. 17 contains a graph illustrating the absorption qualities of germanium.

The band gap of germanium (~0.72 eV) allows for efficient absorption of near-IR wavelength light, as illustrated in FIG. 17. A poly-germanium layer can be formed using various conventional techniques including, but not limited to physical vapor deposition (PVD) or chemical vapor deposition (CVD).

The present invention involves the confinement of light into silicon waveguides with very narrow dimensions (for example, height<1 μm, width~1 μm). The tight confinement of light enables the fabrication of detectors with very small dimensions. The narrow waveguide geometry also relaxes the limitation associated with the prior art large area detectors, such as the prior art arrangement of FIG. 1. Material defects such as threading dislocations and small grain size adversely affect of the performance of the prior art detector. Techniques of the thin-film transistor industry, such as cyclic annealing and laser annealing, can be used to improve the quality of the poly-germanium material for better electrical and optical performance. Appropriate process control during the formation of the poly-germanium detector of the present invention allows for changing the dimensions of grain size and threading dislocations to improve detector performance in terms of lower dark current, increased carrier lifetime and higher mobility.

The poly-germanium material can also be doped with suitable dopants, such as boron for p-type doping or P, As or Sb for n-type doping, to create a lateral p-i-n structure. A p-i-n based photodetector can also be formed using appropriately positioned contacts (electrodes). For example, an undoped absorbing layer of germanium may be disposed between a p-type highly doped contact layer and an n-type highly doped contact layer. When a reverse bias is applied to the photodetector, the depletion region width increases, reducing the transit time of carriers. The optical mode propagating in the silicon waveguide of the SOI structure creates electron-hole pairs when interacting with the poly-germanium region. The electron-hole pairs are collected by the appropriately positioned electrodes. The collection efficiency depends upon the distance between the two electrodes, as well as the quality of the poly-germanium material.

The generation of electron-hole pairs is directly related to the absorption of light, since every absorbed photon generates one electron-hole pair. The optical generation rate $g_{OP}$ is given by:

$$g_{op} = \left(\frac{\alpha P_{in}\lambda}{Ahc}\right)$$

where A is the illuminated area of the photodiode, $P_{in}$ is the incident power, α is the absorption coefficient, h is Planck's constant, c is the velocity of light in a vacuum, and λ is the wavelength of light. As an example, using a poly-germanium detector having the dimensions of 1 μm×10 μm×0.2 μm, if an input light signal at λ=1.55 μm and power of 1 μW is absorbed into the detector, then the number of electron-hole pairs generated in the volume of the detector is equal to about 8×10$^{13}$ cm$^{-3}$. Therefore, the thermally generated electron-hole pair concentration equals about 20. Due to the tight confinement of light, a significant amount of power is delivered to the poly-germanium detector, resulting in at least two orders of magnitude more electron-hole pairs compared to thermal generation.

Assuming all electron-hole pairs generated contribute to the photocurrent, the photocurrent can be given by the following integral:

$$I_{ph} = qA \int_{-xp}^{xn+d} g_{op} dx$$

where d is the thickness of the undoped region (which depletes), q is the electronic charge, and the integration is taken over the width of the depletion region. In all cases, the integral may be reduced to:

$$I_{ph} \frac{q(1-R)P_{in}\lambda}{hc}(1-e^{-\alpha d})$$

where R is the reflection at the interface of the waveguide and the detector. A near-IR wavelength light with λ=1.55 μm, $P_{in}$=1 μW and α=10$^3$ cm$^{-1}$ results in 1 μA of current for a 10 μm long detector. In the prior art, conventional dark currents on the order of 10$^{-3}$ A/cm$^2$ have been reported for normal incidence detectors, such as that shown in FIG. 1. In contrast, the expected dark currents for the poly-germanium-based waveguide detectors of the present invention (~10 μm$^2$) are on the order of 1 nA, resulting in a higher signal-to-noise ratio.

In most of the embodiments of the present invention, waveguide layer 16 will comprise one of three geometries: (1) slab, (2) strip, or (3) rib. FIGS. 3(a) and (b) contain cross-sectional and isometric views, respectively, of a slab waveguide SOI-based structure. In this example, upper silicon waveguide layer is denoted 16$_{slab}$. The cross-sectional view of FIG. 3(a) also illustrates an exemplary optical mode for a signal propagating along slab waveguide 16$_{slab}$. As a result of the sub-micron thickness of silicon slab waveguide 16$_{slab}$, an evanescent tail of the optical mode extends beyond waveguide layer 16$_{slab}$, making the mode very sensitive to both top surface 17 and bottom surface 19 of waveguide layer 16$_{slab}$. Advantageously, a poly-germanium detector may be disposed over top surface 17 of waveguide layer 16$_{slab}$ to capture that portion of the optical mode extending above top surface 17 of layer 16.

Figure 3:
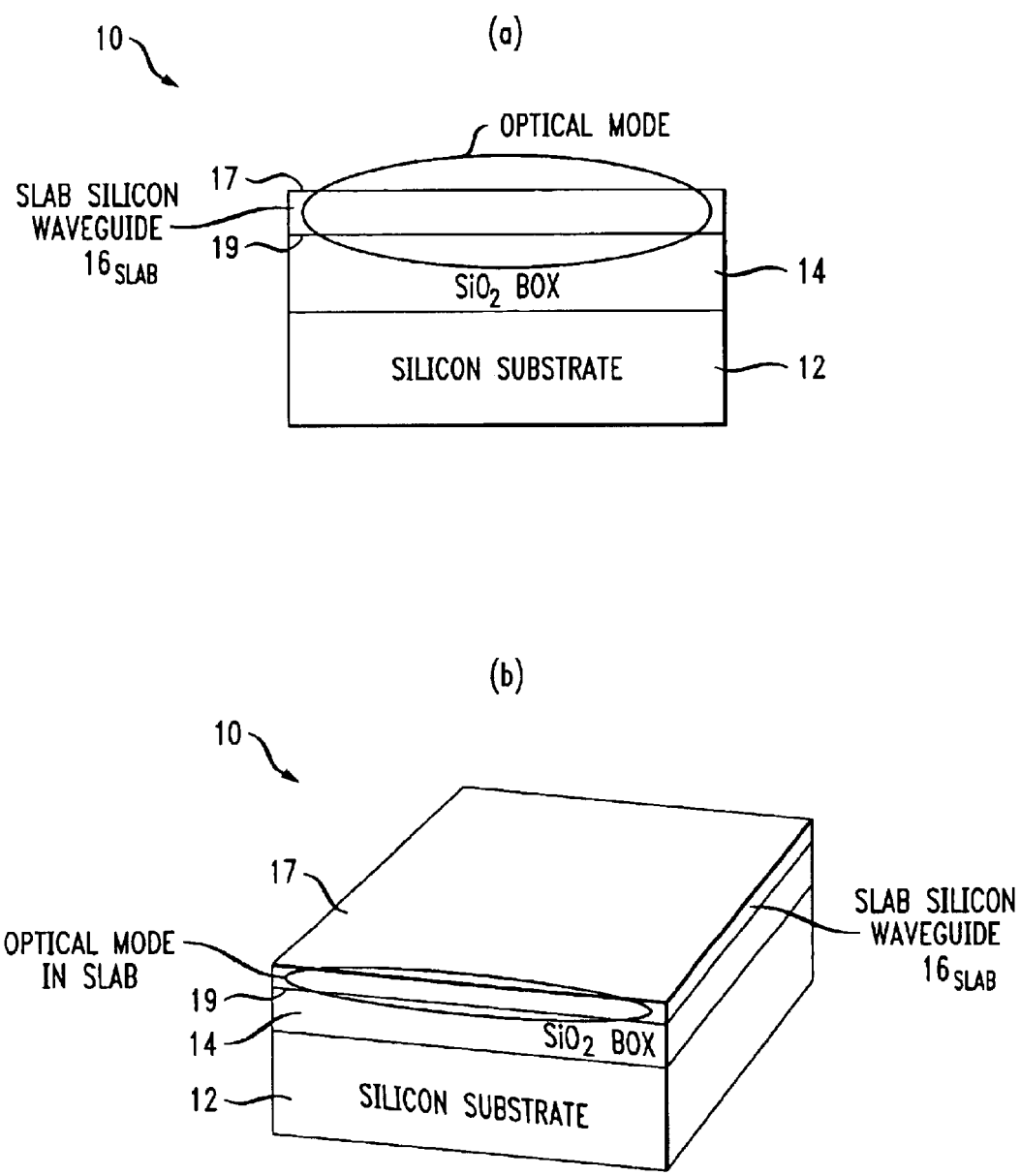
FIGS. 3(a) and (b) contain cross-sectional and isometric views, respectively, of an exemplary SOI structure including a slab waveguide.
Figure 4:
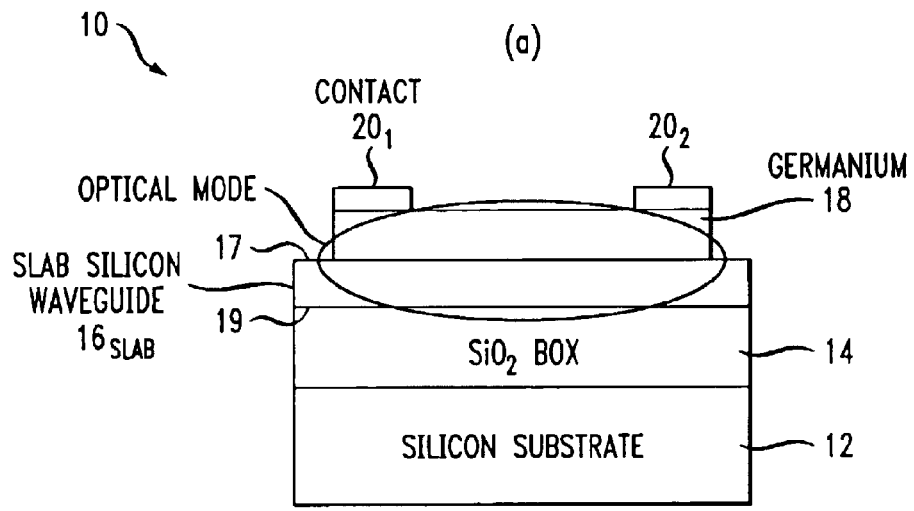
FIGS. 4(a) and (b) contain cross-sectional and isometric views, respectively, of a poly-germanium detector formed on the slab waveguide SOI structure of FIG. 3.
Figure 4:
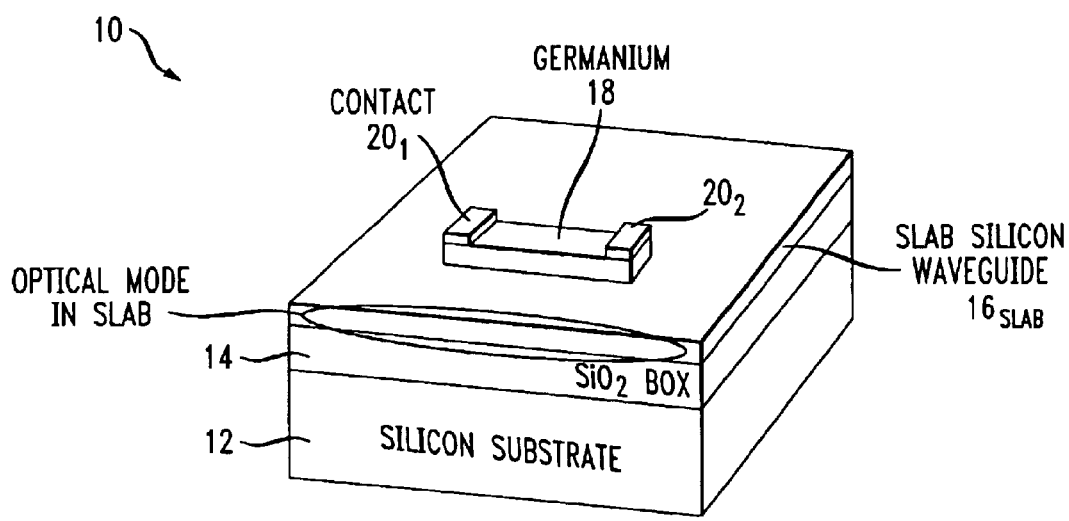

FIGS. 4(a) and (b) illustrate an exemplary photodetector of the present invention as used with a slab waveguide, where a poly-germanium layer 18 is disposed on top surface 17 of the SOI-based structure 10 of FIG. 3. Also with reference to FIG. 2, it is shown clearly in FIG. 4(a) that the optical mode is coupled into poly-germanium layer 18, allowing for absorption to take place. As shown, a pair of electrical contacts 20$_1$ and 20$_2$ are formed along opposing sides of layer 18, where the amount of absorption will be controlled by the length of layer 18 along the lateral dimension of structure 10. In one arrangement not illustrated, an array of such detectors can be formed upon the same waveguide layer 16$_{slab}$ and used to absorb different wavelengths propagating along the same layer 16$_{slab}$ (such as, for example, in a wavelength division multiplexed (WDM) communication system).

Figure 5:
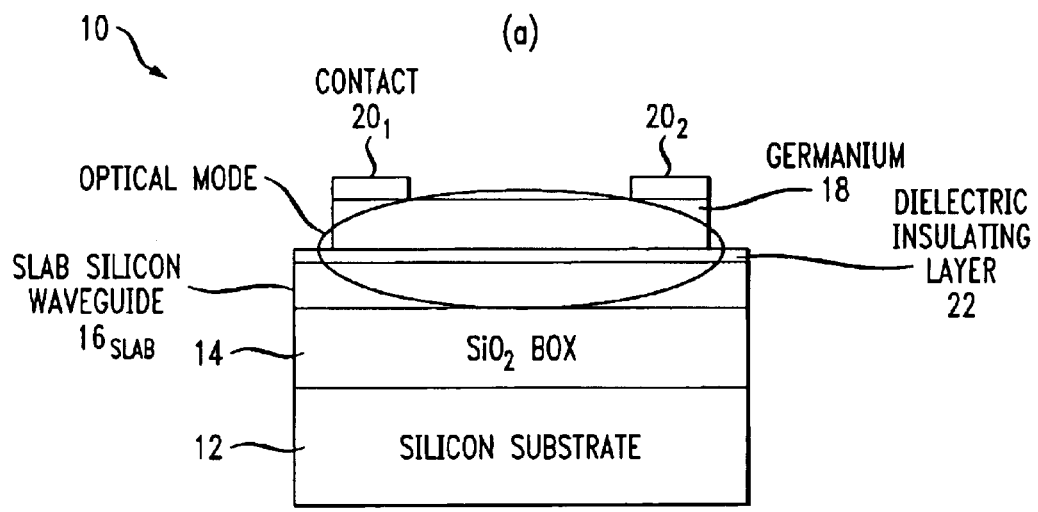
FIGS. 5(a) and (b) contain cross-sectional and isometric views, respectively, of an alternative embodiment of the arrangement of FIG. 4, including a dielectric layer interposed between the waveguide and detector.
Figure 5:
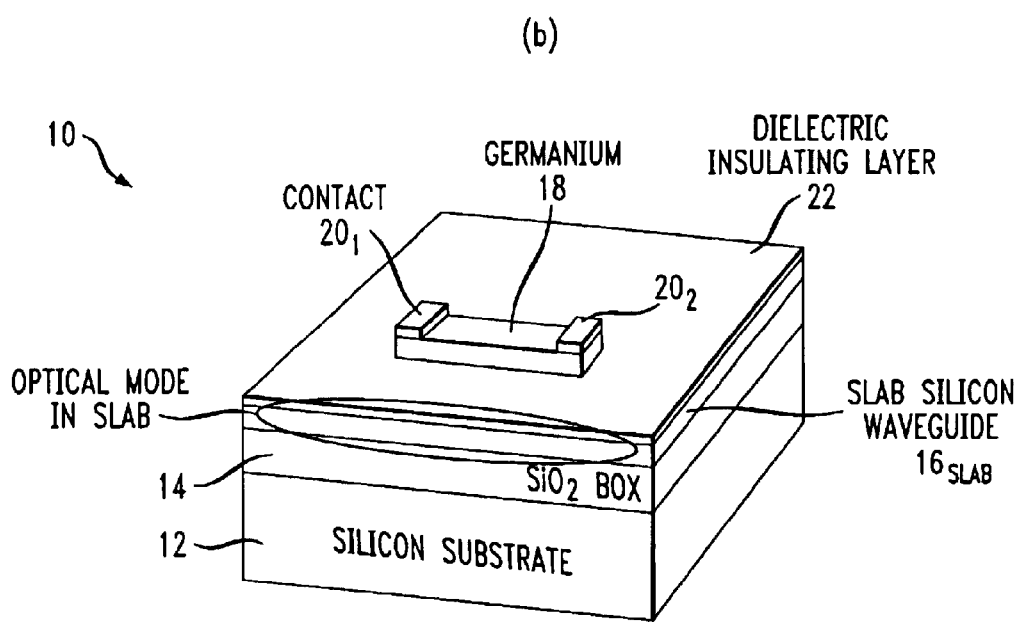

If it is desired to electrically isolate the detector from silicon waveguide layer 16$_{slab}$, a dielectric layer 22 (such as, for example, SiO$_2$) may be disposed to cover top surface 17 of waveguide layer 16$_{slab}$. FIGS. 5(a) and (b) illustrate a cross-sectional view and isometric view, respectively, of such a structure. In most cases, this layer may be grown over the underlying silicon waveguide layer 16$_{slab}$. Alternatively, layer 22 may be deposited. It has been found useful to include a dielectric layer 22 in the photodetector structure of the present invention to simplify the process integration of introducing the poly-germanium detector layer 18 with the silicon waveguide layer 16.

FIGS. 6(a) and (b) contain a cross-sectional and isometric view, respectively, of a strip waveguide SOI-based structure. In this example, upper silicon strip waveguide layer is denoted 16$_{strip}$. The cross-sectional view of FIG. 6(a) also illustrates an exemplary optical mode for a signal propagating along strip waveguide 16$_{strip}$. As a result of the sub-micron thickness and width of silicon strip waveguide $16_{strip}$, the optical mode is well-confined in both the horizontal and vertical dimensions, thus exhibiting a higher signal power as a function of lateral dimension than the slab waveguide geometry of FIG. 3.

Figure 6:
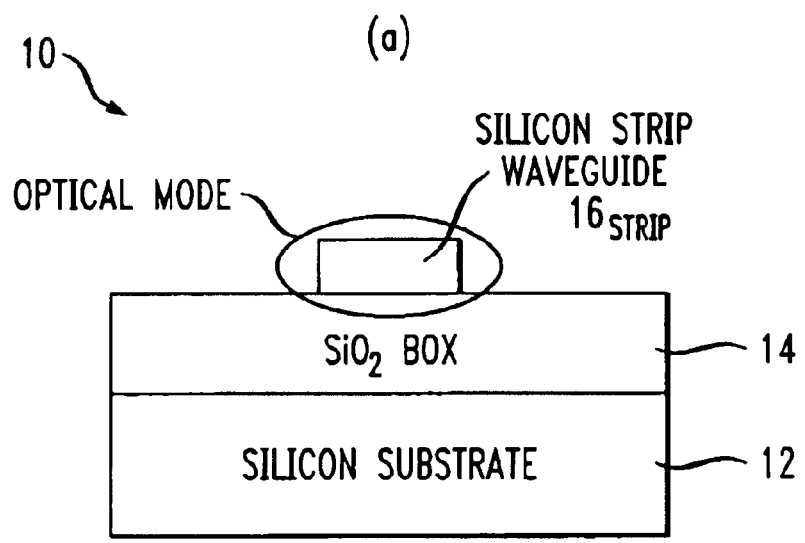
FIGS. 6(a) and (b) contain cross-sectional and isometric views, respectively, of an exemplary SOI structure including a strip waveguide.
Figure 6:
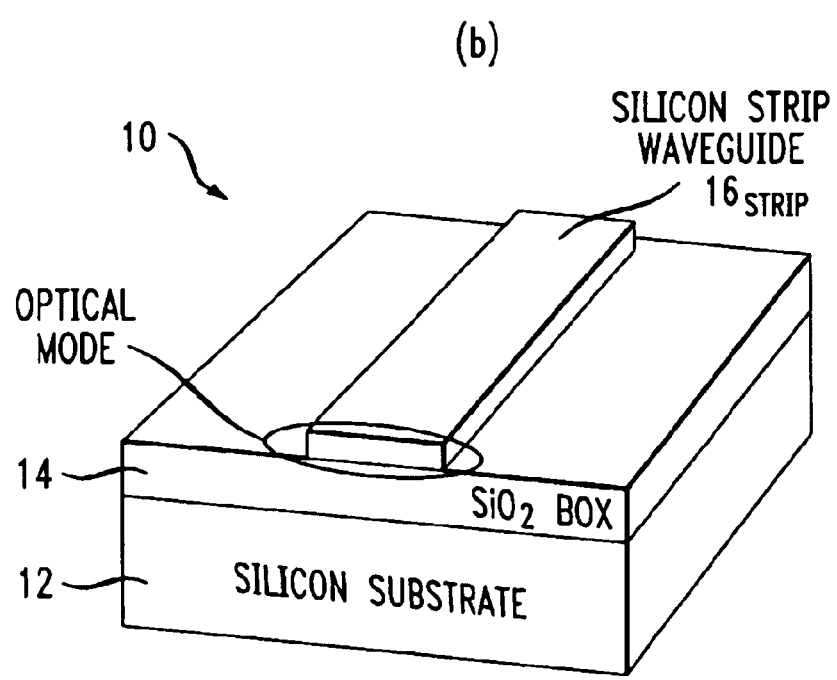
Figure 7:
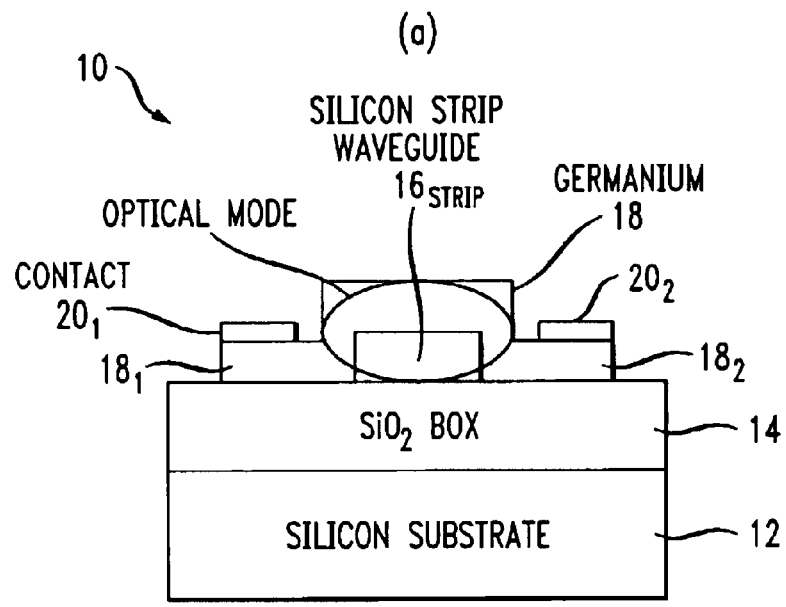
FIGS. 7(a) and (b) contain cross-sectional and isometric views, respectively, of a poly-germanium detector formed on the strip waveguide SOI structure of FIG. 6.
Figure 7:
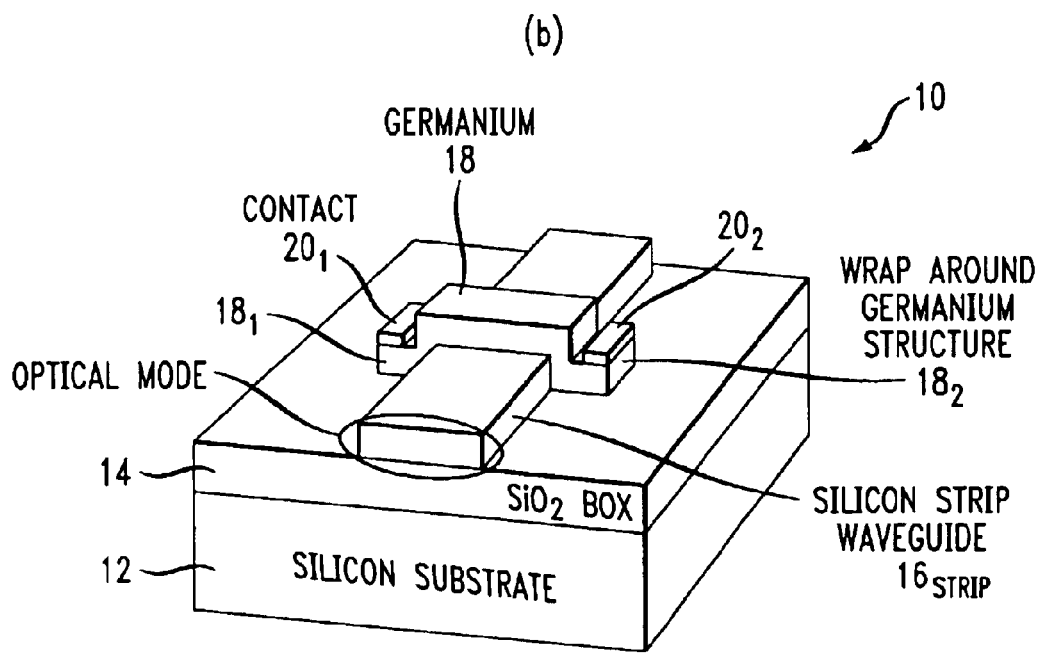

FIGS. 7(a) and (b) illustrate an exemplary poly-germanium photodetector arrangement of the present invention utilizing the strip waveguide geometry illustrated in FIG. 6. As evident in FIG. 7, poly-germanium detector layer 18 is formed to comprise a "wrap-around" geometry so as to completely cover both the top and side surfaces of silicon strip waveguide layer $16_{strip}$. In particular, detector layer 18 is formed to comprise a first side portion $18_1$ that contacts the top surface of buried oxide layer 14 on one side of waveguide layer $16_{strip}$, and a second side portion $18_2$ that contacts the top surface of buried oxide layer 14 on the opposing side of waveguide layer $16_{strip}$, as clearly illustrated in both FIGS. 7(a) and (b). In this case, first electrical contact $20_1$ is disposed over first portion $18_1$ of poly-germanium layer 18 and second electrical contact $20_2$ is disposed over second portion $18_2$ of poly-germanium layer 18. Although strip waveguide layer $16_{strip}$ is illustrated as rectangular in cross-section, other geometries are possible. Also, various strip waveguide configurations including Y-splitters, ring resonators and/or couplers may be formed, with separate detectors disposed in a similar wrap-around configuration along various waveguide portions.

Figure 8:
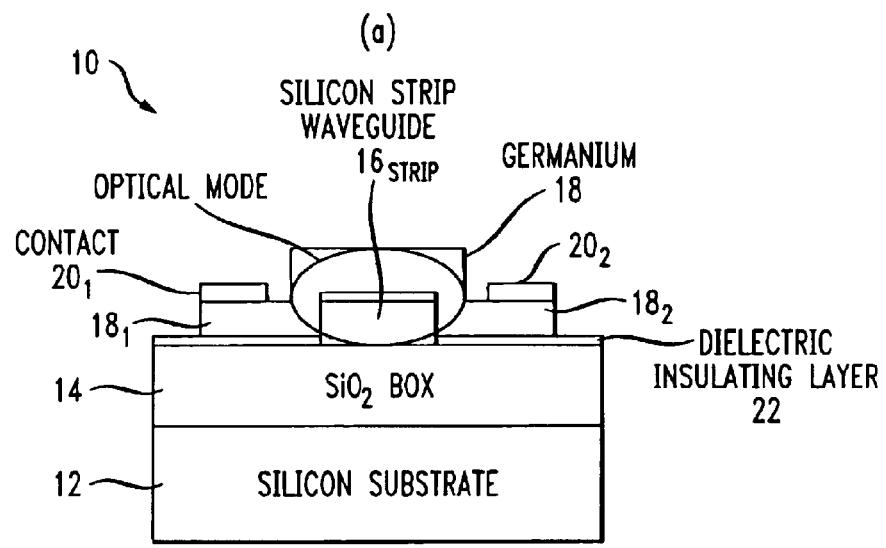
FIGS. 8(a) and (b) contain cross-sectional and isometric views, respectively, of an alternative embodiment of the arrangement of FIG. 7, including a dielectric layer interposed between the waveguide and detector.
Figure 8:
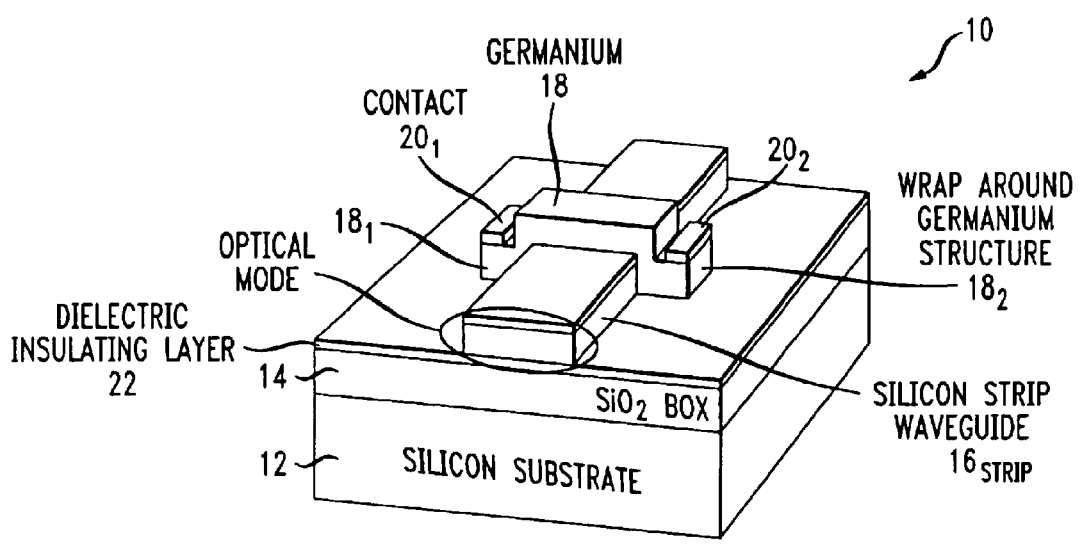

As with the slab configuration discussed above, a dielectric layer 22 may be disposed between silicon strip waveguide layer $16_{strip}$ and poly-germanium photodetector layer 18, as shown in FIG. 8. This layer 22 is used to provide electrical isolation between waveguide layer 16 and electrical contacts 20 associated with poly-germanium detector 18. Dielectric layer 22, if chosen of a proper material, may also simplify the process of integrating poly-germanium layer 18 with the conventional SOI structure 10.

FIGS. 9(a) and (b) contain a cross-sectional and isometric view, respectively, of a rib waveguide structure. In this example, a polysilicon rib waveguide layer $16_{rib}$ is formed over a portion of slab silicon waveguide layer $16_{slab}$. The use of polysilicon rib $16_{rib}$, in combination with slab waveguide layer $16_{slab}$, functions to pull the optical mode up into the rib section, thereby enabling lateral confinement for the slab waveguide geometry. The cross-sectional view of FIG. 9(a) clearly illustrates the coupling of an exemplary optical mode into rib waveguide layer $16_{rib}$. As a result of the sub-micron thickness and width of silicon rib waveguide $16_{rib}$, an evanescent tail of the optical mode extends beyond waveguide layer $16_{rib}$, making the mode very sensitive to both top surface 17 and bottom surface 19 of rib waveguide layer $16_{rib}$. Advantageously, a poly-germanium detector may be disposed over top surface 17 of waveguide layer $16_{slab}$ to capture that portion of the optical mode extending above top surface 17 of layer 16.

Figure 9:
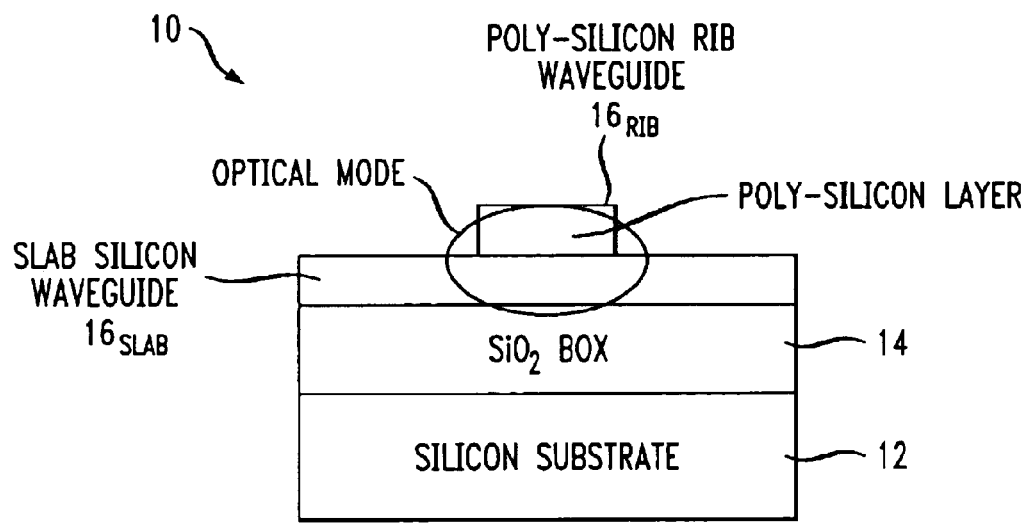
FIGS. 9(a) and (b) contain cross-sectional and isometric views, respectively, of an exemplary SOI structure including a rib waveguide.
Figure 9:
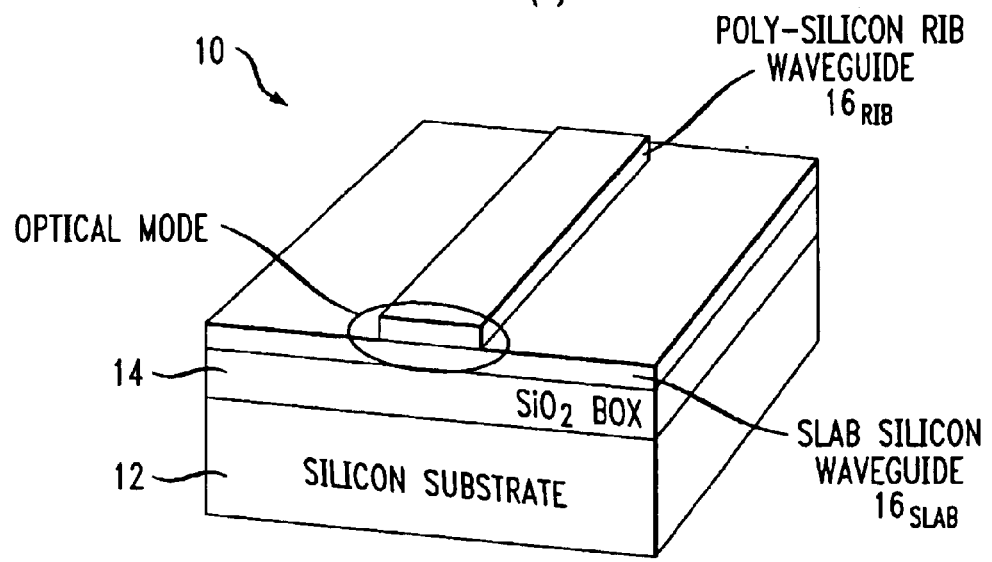
Figure 10:
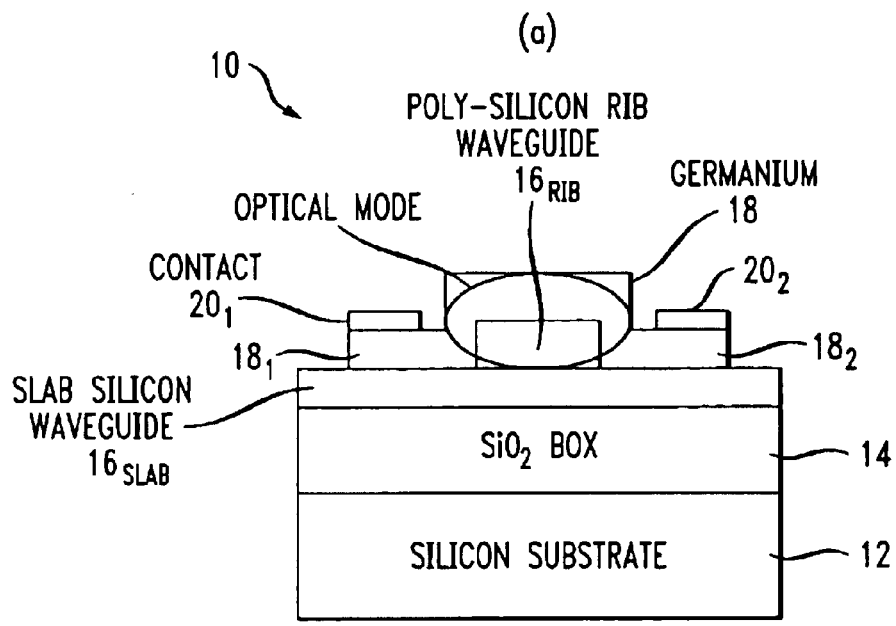
FIGS. 10(a) and (b) contain cross-sectional and isometric views, respectively, of a poly-germanium detector formed on the rib waveguide SOI structure of FIG. 9.
Figure 10:
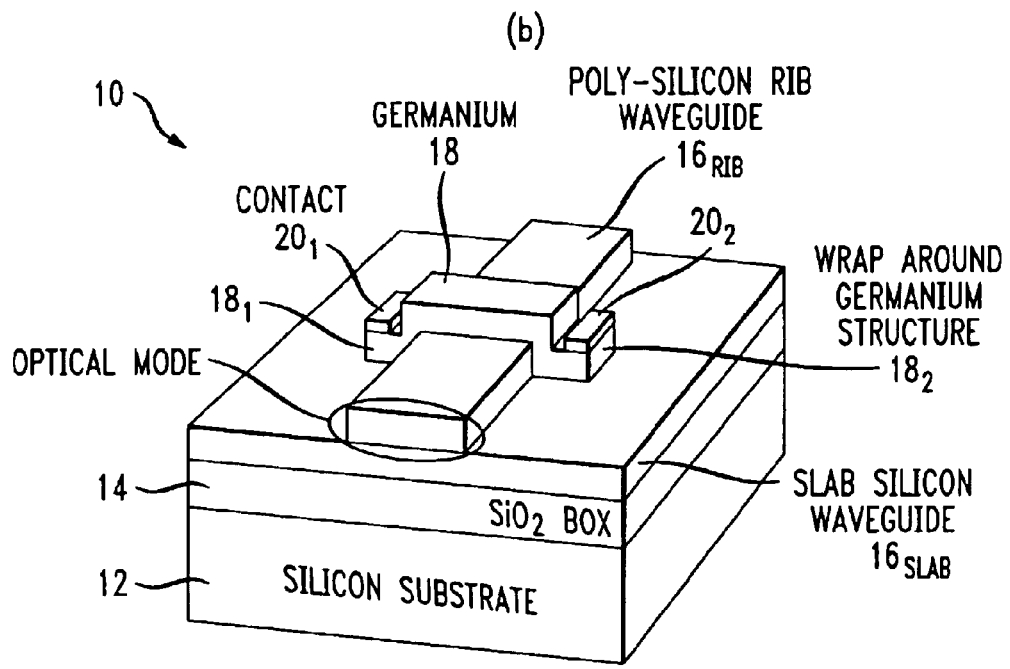

FIGS. 10(a) and (b) illustrate an exemplary poly-germanium photodetector arrangement of the present invention utilizing the rib waveguide geometry illustrated in FIG. 9. As evident in FIG. 10, and similar to the arrangement described above in association with FIG. 7, poly-germanium detector layer 18 is formed to comprise a "wrap-around" geometry so as to completely cover both the top and side surfaces of polysilicon rib waveguide layer $16_{rib}$. In particular, detector layer 18 is formed to comprise a first side portion $18_1$ that contacts the top surface of silicon slab waveguide layer $16_{slab}$ on one side of rib waveguide layer $16_{rib}$, and a second side portion $18_2$ that contacts the top surface of silicon slab waveguide layer $16_{slab}$ on the opposing side of rib waveguide layer $16_{rib}$, as clearly illustrated in both FIGS. 10(a) and (b). In this case, first electrical contact $20_1$ is disposed over first portion $18_1$ of poly-germanium layer 18 and second electrical contact $20_2$ is disposed over second portion $18_2$ of poly-germanium layer 18. Although rib waveguide $16_{rib}$ is illustrated as rectangular in cross-section, other geometries are possible. Also, various rib waveguide configurations including Y-splitters, ring resonators and/or couplers may be formed, with separate detectors disposed in a similar wrap-around configuration along various waveguide portions.

Figure 11:
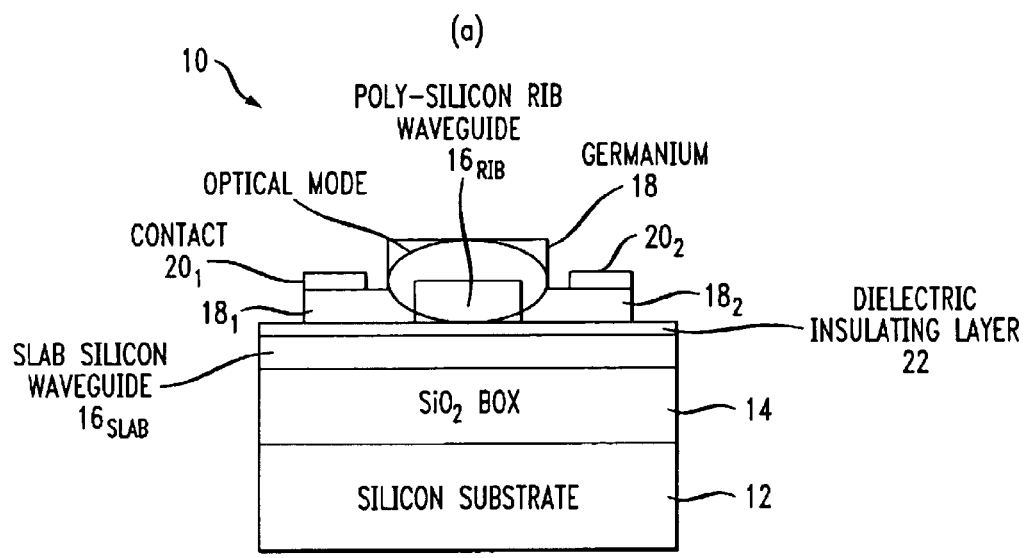
FIGS. 11(a) and (b) contain cross-sectional and isometric views, respectively, of an alternative embodiment of the arrangement of FIG. 10, including a dielectric layer interposed between the slab waveguide layer and the rib waveguide structure.
Figure 11:
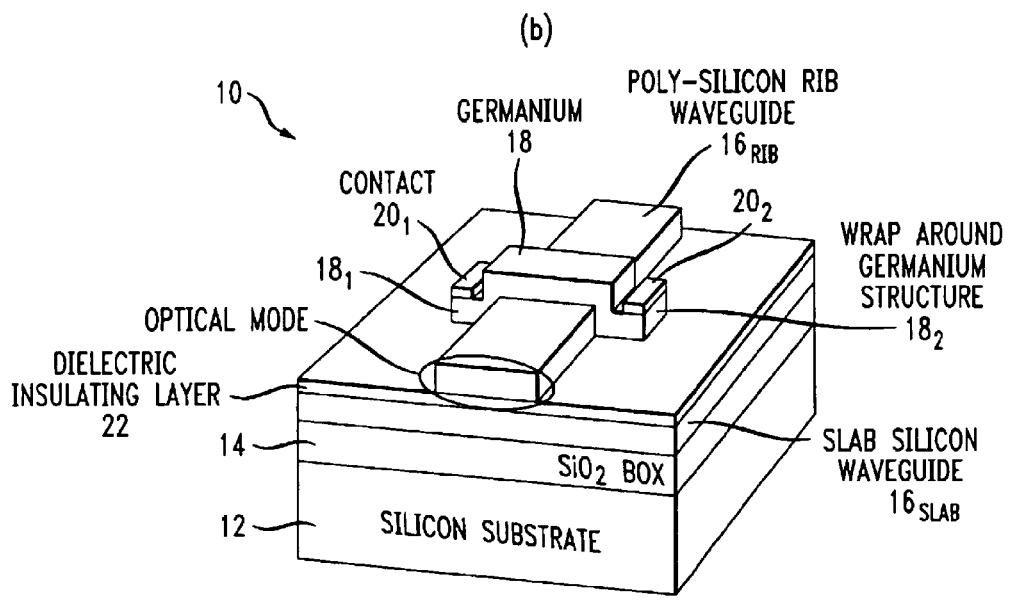

Similar to the slab and strip configurations discussed above, a dielectric layer 22 may be disposed between silicon slab waveguide layer $16_{slab}$ and polysilicon rib waveguide layer $16_{rib}$, as shown in FIG. 11. This layer 22 is used to provide electrical isolation between waveguide layer 16 and electrical contacts 20 associated with poly-germanium detector 18. Dielectric layer 22, if chosen of a proper material, may also simplify the process of integrating poly-germanium layer 18 with the conventional SOI structure 10.

Figure 12:
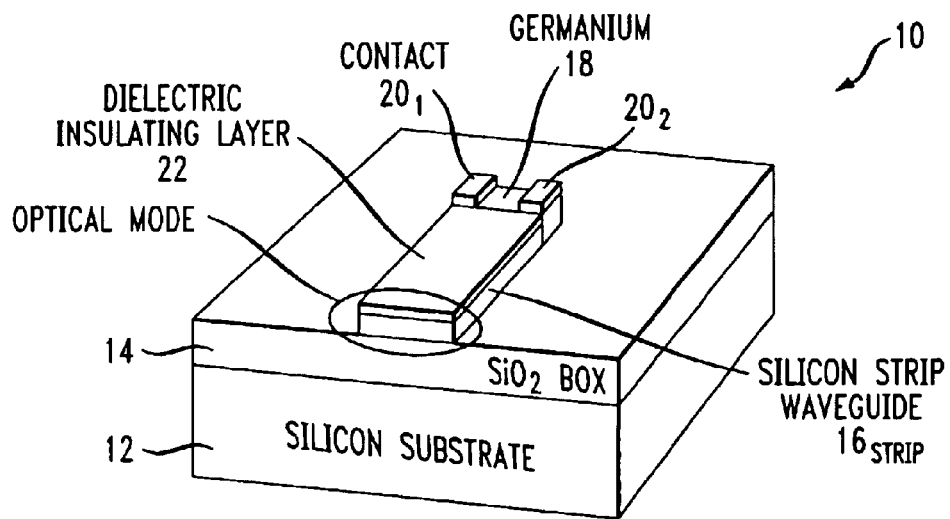
FIG. 12 contains a side view of an SOI-based strip waveguide arrangement with a poly-germanium detector of the present invention formed at the termination of the strip waveguide along a top surface of the SOI structure.
Figure 13:
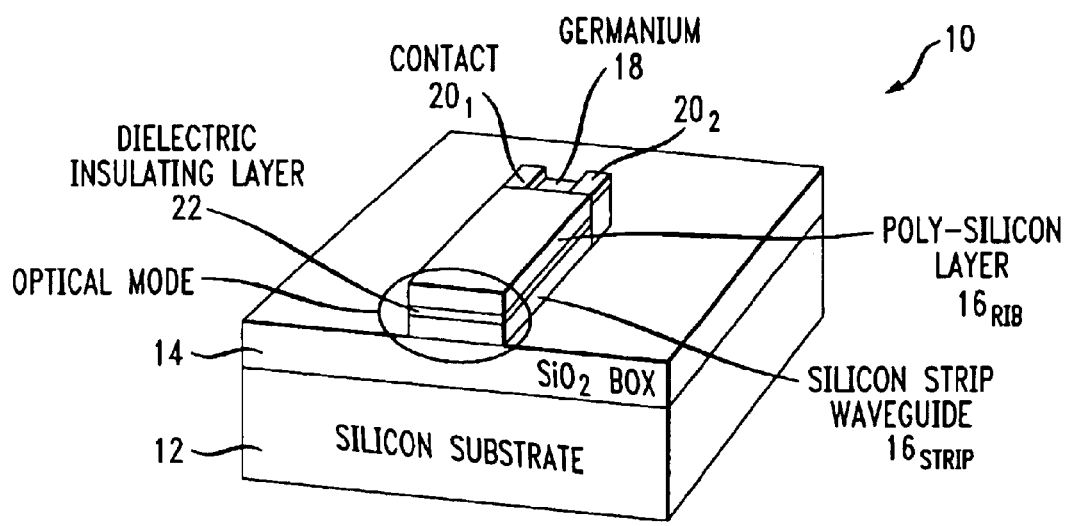
FIG. 13 contains a side view of an SOI-based rib waveguide arrangement with a poly-germanium detector of the present invention formed at the termination of the rib waveguide along a top surface of the SOI structure.

FIG. 12 contains an isometric view of an alternative embodiment of the present invention, formed using a silicon strip waveguide layer $16_{strip}$ and poly-germanium detector layer 18 formed as a coplanar structure. In particular and as shown in FIG. 12, poly-germanium detector layer 18 is disposed at a termination area T of silicon strip waveguide layer $16_{strip}$. As before, a pair of electrical contacts $20_1$ and $20_2$ are disposed along opposing sides of detector layer 18. This particular embodiment of the present invention may be used when complete optical-to-electrical conversion is required since the optical mode propagating along strip waveguide layer $16_{strip}$ will be completely absorbed into poly-germanium layer 18, creating electron-hole pairs. FIG. 13 illustrates an alternative embodiment of the arrangement of FIG. 12, incorporating a dielectric layer 22 between silicon strip waveguide layer $16_{strip}$ and silicon rib waveguide layer $16_{rib}$. As with the arrangement of FIG. 12, all of the propagating optical signal will be absorbed by poly-germanium detector layer 18. FIG. 13 contains an isometric view of a poly-silicon rib waveguide structure formed upon a dielectric layer 22 that is disposed upon a silicon strip waveguide. A poly-germanium detector 18 is disposed at a termination of both the poly-silicon rib and the silicon strip waveguide layers.

Figure 14:
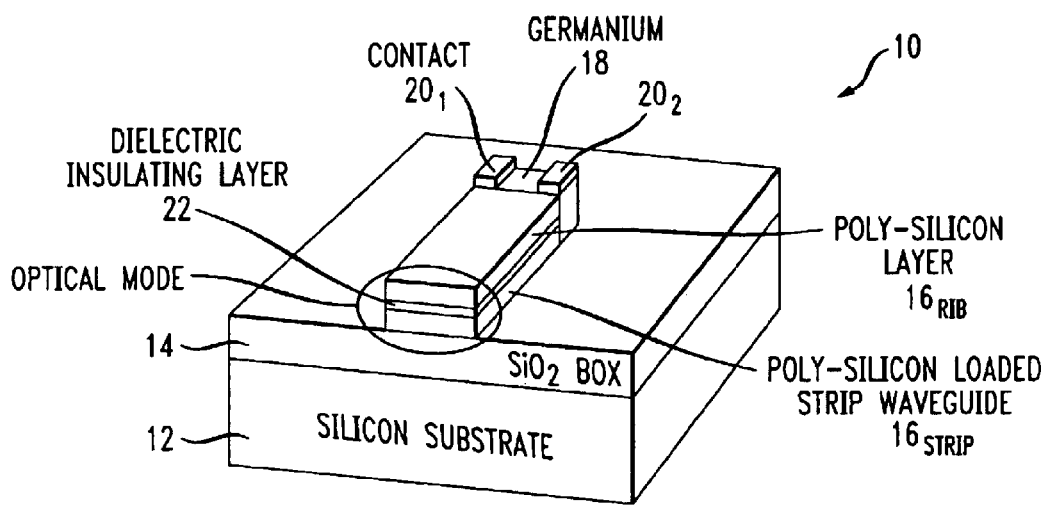
FIG. 14 contains a side view of a poly-silicon rib waveguide formed on a poly-silicon strip waveguide separated by a dielectric insulating layer, with a poly-germanium detector having contacts formed at the end of the waveguide coupled to the strip waveguide.

The arrangement shown in FIG. 14 is different in that germanium layer 18 is not directly formed on buried oxide layer 14, but rather is disposed over a section of a poly-silicon loaded strip waveguide layer $16_{strip}$. As with the arrangements discussed above, a dielectric layer 22 may be disposed between poly-silicon loaded strip waveguide layer $16_{strip}$ and polysilicon rib waveguide layer $16_{rib}$, as shown in FIG. 15.

Figure 15:
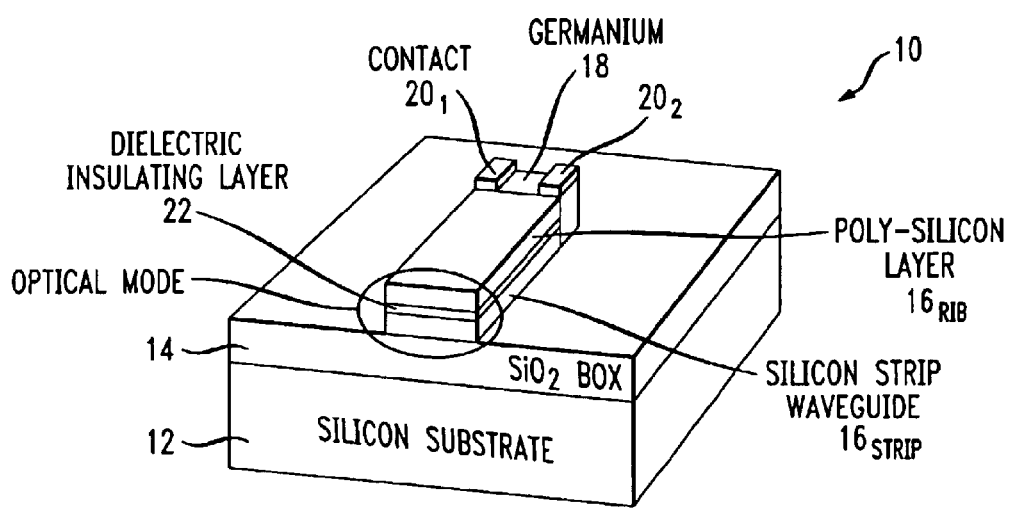
FIG. 15 contains a side view of a poly-silicon rib waveguide formed on a silicon strip waveguide separated by a dielectric insulating layer, with a poly-germanium detector formed upon the silicon strip waveguide at the end of the waveguide.

The arrangement shown in FIG. 15 is slightly different in that germanium layer 18 is not directly formed on buried oxide layer 14, but rather is disposed over a section of a silicon loaded strip waveguide layer $16_{strip}$. As with the arrangements discussed above, a dielectric layer 22 may be disposed between silicon loaded strip waveguide layer $16_{strip}$ and poly-silicon rib waveguide layer $16_{rib}$, as shown in FIG. 15.

Figure 16:
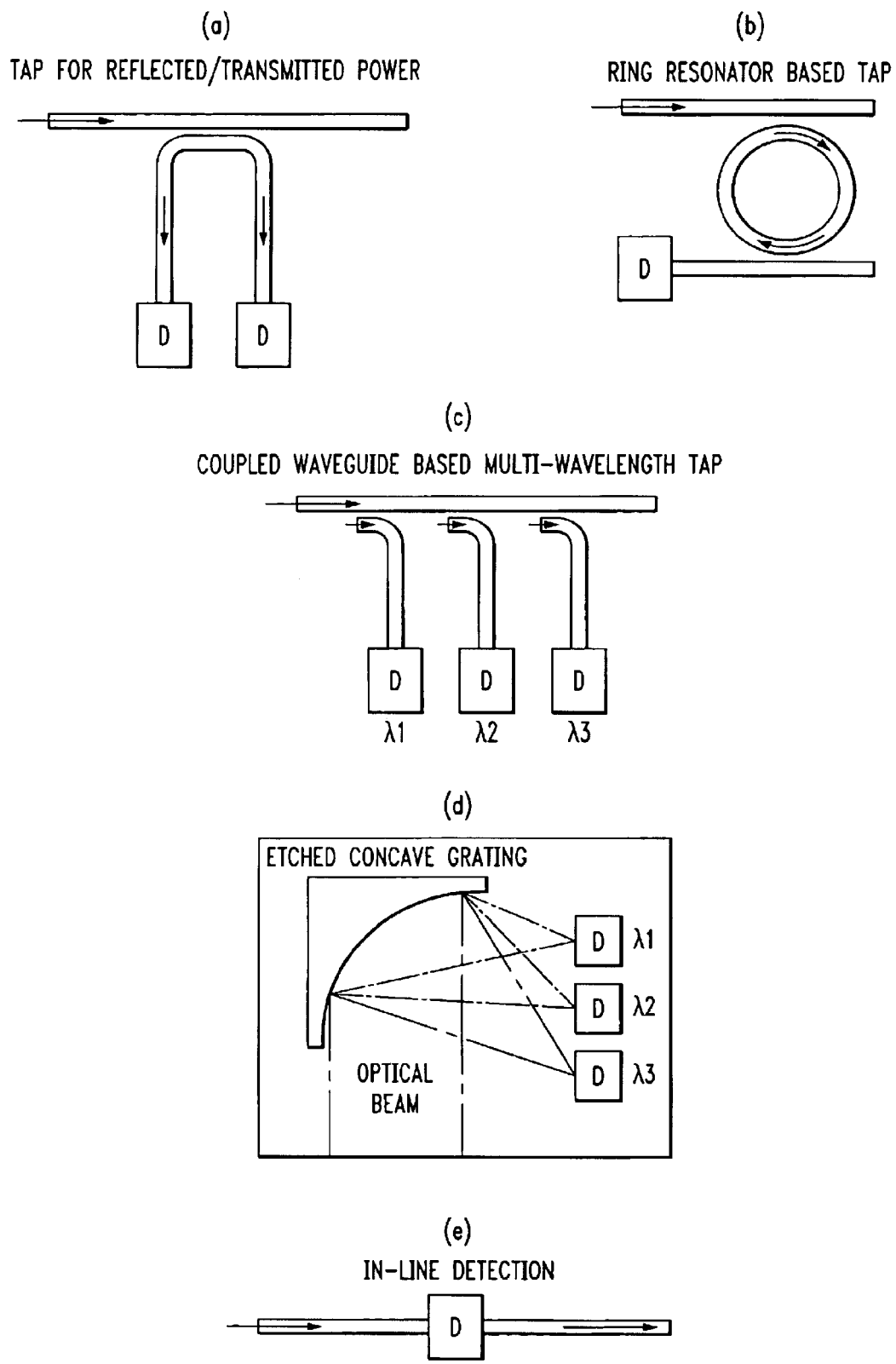
FIGS. 16(a)–(e) illustrate various opto-electronic systems utilizing the poly-germanium detector of the present invention.

FIGS. 16(a)–(e) illustrate various systems, in high-level form, that may utilize the SOI-based planar poly-germanium detector of the present invention. There are several advantages of using the arrangement of the present invention over the conventional normal incidence detectors, as discussed above in association with FIG. 1. First, use of discrete InGaAs detectors is considered as a less practical approach than that of the present invention, where the poly-germanium detector is directly formed upon the narrow waveguides of the SOI structure. Additionally, a coupled waveguide-based tap can be used to monitor transmitted/reflected power, as shown in FIG. 16(a). A conventional prior art approach of tapping off a particular wavelength requires expensive optical filters and precise optical alignment. In accordance with the present invention, a simple ring resonator configuration (FIG. 16(b)) can be used to tap off a particular wavelength for either monitoring purposes or for complete drop off. Multiple "taps" can then be used with a plurality of separate waveguides to monitor different wavelengths (see FIG. 16(c)). A common method of wavelength multiplexing/demultiplexing involves the use of expensive multi-layer narrowband dielectric thin-film filters, which require precise optical alignment and are not considered cost effective. In accordance with the present invention, a concave grating etched in silicon can be used (as shown in FIG. 16(d)) to demultiplex different wavelengths into separate silicon waveguides, with separate poly-germanium detectors associated with each waveguide. In-line detection, another useful monitoring function, is also simplified by using the poly-germanium detector of the present invention, as shown in FIG. 16(e).

It is to be understood that the above-described embodiments of the present invention are considered to be exemplary only and should not be considered to define or limit the scope of the present invention, as defined by the claims appended hereto:

What is claimed is:

1. A photodetector structure based on a silicon-on-insulator (SOI) platform, the structure comprising:
a silicon substrate including a top major surface;
a buried oxide layer disposed to cover the top major surface of said silicon substrate, said buried oxide layer including a top major surface;
a sub-micron thickness silicon optical waveguide layer disposed to cover at least a portion of the buried oxide layer top major surface;
a poly-germanium detector layer disposed to contact a portion of the silicon optical waveguide layer; and
a pair of electrical contacts disposed on opposing lateral terminals of the poly-germanium detector layer, wherein said poly-germanium detector layer exhibits a band gap suitable for absorbing an optical signal propagating along the sub-micron thickness silicon optical waveguide layer and generating an electrical output signal between the pair of electrical contacts.

2. A photodetector structure as defined in claim 1 wherein the structure further comprises a dielectric layer disposed between the sub-micron thickness silicon optical waveguide layer and the poly-germanium detector layer.

3. A photodetector structure as defined in claim 2 where the dielectric layer comprises a grown $SiO_2$ layer.

4. A photodetector structure as defined in claim 1 wherein the sub-micron thickness silicon optical waveguide layer comprises a slab geometry, with the poly-germanium detector layer disposed to cover a top major surface portion of said slab waveguide layer.

5. A photodetector structure as defined in claim 1 wherein the sub-micron thickness silicon optical waveguide layer comprises a strip geometry, with the poly-germanium detector layer disposed to conformally coat a portion of the top major surface of the buried oxide layer, as well as the side and top surfaces of the silicon strip waveguide layer.

6. A photodetector structure as defined in claim 5 where the pair of electrical contacts are disposed on those portions of the poly-germanium layer in direct contact with the underlying buried oxide layer.

7. A photodetector structure as defined in claim 6 wherein the structure further comprises a dielectric layer disposed between the sub-micron silicon optical strip waveguide layer and the poly-germanium layer.

8. A photodetector structure as defined in claim 6 wherein the silicon strip waveguide comprises a rectangular geometry.

9. A photodetector structure as defined in claim 6 wherein the silicon strip waveguide comprises a geometry including elements such as Y-splitters, ring resonators and/or coupled waveguides.

10. A photodetector structure as defined in claim 6 wherein the poly-germanium detector layer is disposed at an end termination of the silicon strip waveguide layer so as to overly a portion of the top surface of the buried oxide layer.

11. A photodetector structure as defined in claim 1 wherein the sub-micron thickness silicon optical waveguide layer comprises a slab layer, with a poly-silicon rib waveguide disposed to cover a portion of the top major surface of said slab and the poly-germanium detector layer disposed to conformally coat a portion of the top major surface of the rib waveguide layer, as well as the side and top surfaces of the silicon rib waveguide layer.

12. A photodetector structure as defined in claim 11 wherein a dielectric electrical insulating layer is disposed between the silicon slab waveguide layer and the poly-silicon rib waveguide layer.

13. A photodetector structure as defined in claim 11 wherein the poly-silicon rib waveguide comprises a geometry including elements such as Y-splitters, ring resonators and/or coupled waveguides.

14. A photodetector structure as defined in claim 1 wherein the sub-micron thickness silicon optical waveguide layer comprises a silicon strip layer, with a poly-silicon rib waveguide disposed to cover a portion of the top major surface of said strip and the poly-germanium detector layer disposed to conformally coat a portion of the top major surface of the strip waveguide layer, as well as the side and top surfaces of the silicon strip waveguide layer.

15. A photodetector structure as defined in claim 14 wherein the poly-germanium detector layer is disposed at an end termination of both the silicon strip waveguide layer and the poly-silicon rib waveguide layer.

16. A photodetector structure as defined in claim 14 wherein the poly-germanium detector layer is disposed to conformally coat a portion of the top major surface of the silicon strip waveguide layer, as well as the side and top surfaces of the silicon strip waveguide layer at the end termination of the poly-silicon rib waveguide layer.

17. A photodetector structure as defined in claim 14 wherein the sub-micron thickness silicon optical waveguide layer comprises a poly-silicon strip waveguide layer, with a poly-silicon rib waveguide layer disposed to cover a portion of the top major surface of the poly-silicon strip waveguide layer.

18. A photodetector structure as defined in claim 17 wherein the poly-germanium detector layer is disposed at an end termination of both the poly-silicon strip waveguide layer and the poly-silicon rib waveguide layer.

19. A photodetector structure as defined in claim 18 wherein the poly-germanium detector layer is disposed to conformally coat a portion of the top major surface of the poly-silicon strip waveguide layer, as well as the side and top surfaces of the silicon strip waveguide layer at an end termination of the poly-silicon rib waveguide layer.

20. A photodetector structure as defined in claim 1 wherein the poly-germanium detector layer includes lateral regions of p-type and n-type doping to form a PN junction in the detector.

21. A photodetector structure as defined in claim 1 wherein the poly-germanium detector layer includes lateral, separated regions of p-type and n-type doping to form a PIN structure photodetector.

* * * * *

UNITED STATES PATENT AND TRADEMARK OFFICE
CERTIFICATE OF CORRECTION

PATENT NO.        : 6,897,498 B2
APPLICATION NO.   : 10/772724
DATED             : May 24, 2005
INVENTOR(S)       : Gothoskar et al.

It is certified that error appears in the above-identified patent and that said Letters Patent is hereby corrected as shown below:

Please correct column 6 line 5 to read as follows:

$$I_{ph} = \frac{q(1-R)P_{in}\lambda}{hc}(1-e^{-ad})$$

Signed and Sealed this

Fourth Day of March, 2008

JON W. DUDAS
*Director of the United States Patent and Trademark Office*